United States Patent
Hamond

(10) Patent No.: US 9,711,312 B2
(45) Date of Patent: Jul. 18, 2017

(54) METHOD FOR CONTROLLING AN ELECTROMAGNETIC CONTACTOR AND ELECTROMAGNETIC CONTACTOR IMPLEMENTING SUCH A METHOD

(71) Applicant: ABB FRANCE, Courtaboeuf (FR)

(72) Inventor: Christophe Hamond, Messimy (FR)

(73) Assignee: ABB SCHWEIZ AG, Baden (CH)

( * ) Notice: Subject to any disclaimer, the term of this patent is extended or adjusted under 35 U.S.C. 154(b) by 45 days.

(21) Appl. No.: 13/962,407

(22) Filed: Aug. 8, 2013

(65) Prior Publication Data

US 2014/0043716 A1    Feb. 13, 2014

(30) Foreign Application Priority Data

Aug. 8, 2012 (FR) ...................... 12 57696

(51) Int. Cl.
*H01H 47/20* (2006.01)
*H01H 51/34* (2006.01)
*H03K 7/08* (2006.01)
*H01H 47/32* (2006.01)

(52) U.S. Cl.
CPC ............... *H01H 51/34* (2013.01); *H03K 7/08* (2013.01); *H01H 47/325* (2013.01)

(58) Field of Classification Search
CPC ........ H01H 47/20; H01H 47/22; H01H 51/34; H01H 47/325; H03K 5/04; H03K 7/08

USPC .......................................... 361/153
See application file for complete search history.

(56) References Cited

U.S. PATENT DOCUMENTS

| | | | |
|---|---|---|---|
| 4,620,259 A * | 10/1986 | Oshizawa | 361/152 |
| 6,661,635 B1 | 12/2003 | Meid | |
| 6,671,158 B1 * | 12/2003 | Underwood | 361/153 |
| 8,400,183 B1 * | 3/2013 | Yeung | H04L 25/0264 326/63 |
| 2007/0290894 A1 * | 12/2007 | Ng | H02M 3/157 341/50 |

FOREIGN PATENT DOCUMENTS

WO    2012035474 A1    3/2012

* cited by examiner

*Primary Examiner* — Ronald W Leja
(74) *Attorney, Agent, or Firm* — Cantor Colburn LLP

(57) ABSTRACT

The present invention relates to a control method for an electromagnetic contactor and an electromagnetic contactor implementing such a method, where the method includes supplying an electromagnet of the contactor with a pulse width modulation supply signal and having a nominal frequency, the method also including varying the period over at least part of the pulses of the modulation so as to reduce the conducted electromagnetic disruptions, the variation of the period being chosen such that the frequency of the supply signal remains comprised in a given frequency band including the nominal frequency.

9 Claims, 2 Drawing Sheets

METHOD FOR CONTROLLING AN ELECTROMAGNETIC CONTACTOR AND ELECTROMAGNETIC CONTACTOR IMPLEMENTING SUCH A METHOD

TECHNICAL FIELD

The present invention relates to a method for controlling an electromagnetic contactor. It also relates to an electromagnetic contactor implementing such a method.

BACKGROUND

An electromagnetic contactor includes an electromagnet that is powered through a control circuit so as to create an electromagnetic force actuating the movement of a moving part or core, which includes contacts designed to close or open an electric circuit.

The control signal for said electromagnet may be of the Pulse Width Modulation (PWM) type, with period T and pulse width T. The ratio T/T is noted as a cyclical ratio. It is known, for a given frequency of the pulse width modulation (PWM) signal and a given waveform, to vary the cyclical ratio T/T so as to modulate transferred energy.

In the situation, it has been noted that, when the control circuit is working in switching in this manner, parasites (harmonics) were generated, primarily by the switching at the charge both by conduction on the conductive power lines, and by radiation, this unfavorable situation being reinforced by the electric charge from the contactor essentially made up of a solenoid or an electromagnet.

BRIEF SUMMARY

The present invention aims to resolve all or some of the aforementioned drawbacks.

To that end, the present invention relates to a control method for an electromagnetic contactor comprising the following steps:
supplying an electromagnet of the contactor with a pulse width modulation supply signal and having a nominal frequency,
varying the period over at least part of the pulses of the modulation so as to reduce the conducted electromagnetic disruptions,
the variation of the period being chosen such that the frequency of the supply signal remains comprised in a given frequency band including the nominal frequency.

According to one aspect of the method, the pulse width of the supply signal is varied.

According to one aspect of the method, the variation of the period of the pulses is determined randomly.

According to one aspect of the method, the variation of the period of the pulses is determined using a deterministic function.

According to one aspect of the method, the function is linear or piecewise linear.

According to another aspect of the method, the variation of the period of the pulses is determined pseudo-randomly.

According to one aspect of the method, the variations of the period are cyclical.

According to one aspect of the method, the variation of the period (T) of the pulses is applied so as to:
preserve a same period over a first plurality of periods;
modify the value of the period for a second plurality of periods.

According to one aspect of the method, the variation of the period of the pulses is applied continuously to each period.

According to one aspect of the method, a caliber is taken into account defining an acceptable disruption limit per frequency value in the frequency band from 150 kHz to 30 MHz.

According to one aspect of the method, the frequency of the power supply signal has a variation for example comprised between 0 and two times the nominal modulation frequency Fch, or according to another example between 0.5 and 1.5 times the nominal modulation frequency Fch, etc.

The present invention also relates to an electromagnetic contactor including a control circuit arranged to carry out the steps of a method as previously described.

According to one aspect of the invention, the control circuit comprises a PWM device arranged to determine a variation of the frequency from the nominal frequency.

According to one aspect of the invention, the modulator comprises means for generating random or pseudorandom values.

BRIEF DESCRIPTION OF THE DRAWINGS

Other features and advantages of the present invention will be better understood using the following description and figures, which are.

DETAILED DESCRIPTION

Figure 1:
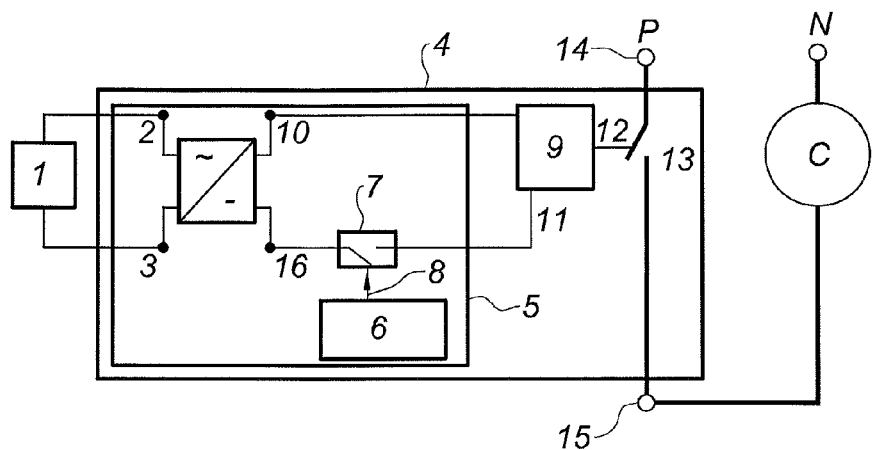
FIG. 1: a diagram of a contactor according to the invention.

FIG. 1 shows a diagram of a contactor according to the invention. The contactor 4 primarily includes a switch 13 or contact member positioned in a power circuit and a control circuit 5 positioned on a control power supply source 1. The control circuit 5 includes a core 12 or moving part and an electromagnet 9. The core 12 maneuvers a lever of the switch 13.

The control circuit 5 is connected to a control power supply source 1. The source 1 withdraws current when a command is issued from the control power supply source 1 toward the control circuit 5 of the contactor 4. To that end, the control circuit 5 of the contactor 4 includes two connection terminals 2 and 3 for connecting to the control power supply source 1.

To use an AC or DC power supply source, a rectifier is connected between a terminal 2 and a first terminal 10, and between the terminal 3 and a second terminal 16.

The connection terminal 16 is connected through the control circuit 5 to a second polarization terminal 11 of the electromagnet 9 of the contactor 4 by means of an electronic switch 7 such as a MOS transistor or a bipolar power transistor. The electronic switch 7 is connected by means of a control terminal 8, like the gate of a MOS transistor or a power bipolar base, to a PWM modulator 6 that generates a square cyclical ratio signal determined as a function of the energy one wishes to transfer to the electromagnet 9 to obtain a correct maneuver and/or maintenance of the core 12.

The core 12 maneuvers the moving lever of the switch 13. The switch 13 is connected across two terminals 14 and 15 of the contactor that are intended to be connected to a power circuit to be controlled by the contactor. Such a power circuit may include a monophasic AC power supply between a phase P and a neutral N and include a charge C like an electric motor.

Figure 2:
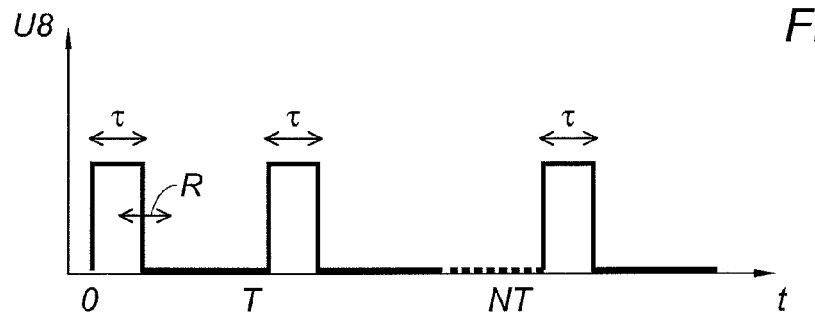
FIG. 2: a graph of a PWM control of an electromagnet of the contactor according to the state of the art.

FIG. 2 shows a graph of a pulse width modulation (PWM) command closing the contactor according to the state of the art. The graph shows the evolution of the control signal U8 applied on the control electrode of the electronic switch 7. The square signal is made up of a repetition of N slots with a duration $\tau$ and a period T that has a cyclical ratio $\tau/T$ determined as a function of a polarization program of the electromagnet. The upper slot for example represents the conduction duration of the electronic switch 7 when its control terminal 8 is connected to the PWM modulator 6. This results in a certain average energy transmitted during the sequence of the N slots of the electromagnet 9. The energy transmitted to the electromagnet 9 may for example assume a reduced value during a period in which the switch 13 is kept closed, so as to reduce the heating of the electromagnet 9. In that case, the conduction duration T may be increased or reduced by adjusting the moment of the pulse edge R of the waveform of FIG. 2.

According to the state of the art, the PWM modulator 6 includes an oscillator producing a nominal frequency Fch that determines the period T of the slots, a registry containing a value representative of the conduction duration $\tau$, a meter charged at the value representative of the conduction duration, and an oscillator with a higher frequency than the nominal frequency Fch. When the meter has reached the value of the register, a latch causes the conduction signal to drop back to zero. Other techniques are known to implement similar means based on ramps and voltage comparison.

However, the presence of a serrated signal U8 on the control terminal 8 of the electronic switch 7 generates a large quantity of parasites that may disrupt the operation of electrical and electronic apparatuses positioned near the contactor 4.

Figure 3:
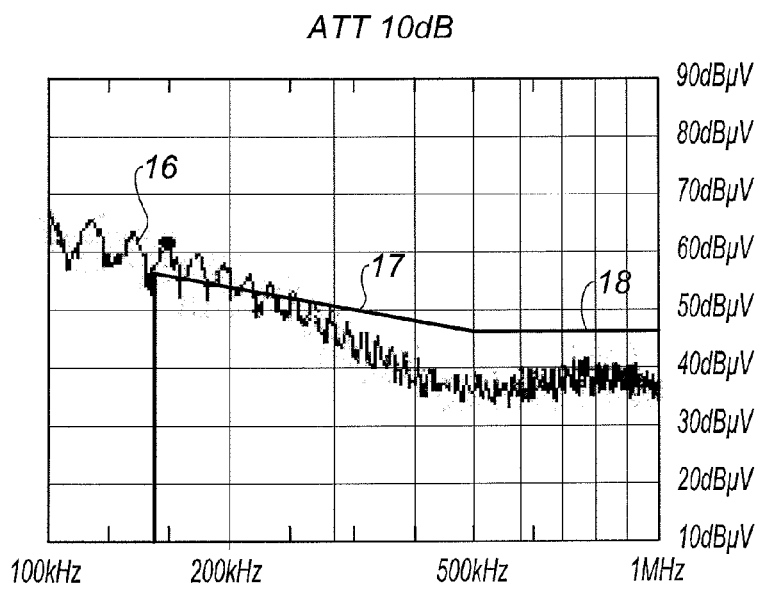
FIG. 3: a graph measuring the parasites generated by the control graph of FIG. 2.

Thus, FIG. 3 shows the emission on the power supply lines of parasites generated by a contactor under PWM control using the control law illustrated in FIG. 2. The amplitude 16 of the current harmonics is shown as a function of the frequency on a semi-logarithmic scale. We have thus shown a limit caliber of the amplitude of the generated parasites that includes a descending ramp 17 of 150 kHz to 500 kHz, then a constant value 18 above 500 kHz.

According to the invention, so as not to exceed the limit caliber of the parasite amplitudes, the modulator 6 is arranged to vary the period T over at least part of the pulses of the modulation so as to reduce the conductive electromagnetic disruptions, the variation of the period T being chosen such that the frequency F of the power supply signal remains comprised in a given frequency band BF including the nominal frequency Fch.

According to one embodiment, the frequency variation of the pulses is determined randomly around the nominal PWM modulation frequency Fch, the parameters of the variation law being determined so as to reduce the amplitude of the parasites in the frequency spectrum. The frequency spectrum here is determined in a band from 150 kHz to 30 MHz.

In the inventive method, the nominal frequency is determined for a sequence of N slots for switching the electronic switch 7 to conduction mode so as to determine an energy transmitted to the electromagnet 9 according to a desired power supply scheme. However, instead of keeping this nominal PWM modulation frequency Fch constant, during the duration of the N pulses, the period T=1/Fch of each pulse of the sequence varies, by a variable value +a or −b. According to the invention, the random frequency variation F, or period, is determined so as to produce spreading of the spectrum generated by switching the power switch 7. $\tau$ also varies in order to keep the ratio T/T constant.

The period T and/or the pulse width T may be constant over a first plurality of periods before being modified over a second plurality of periods.

Figure 4:
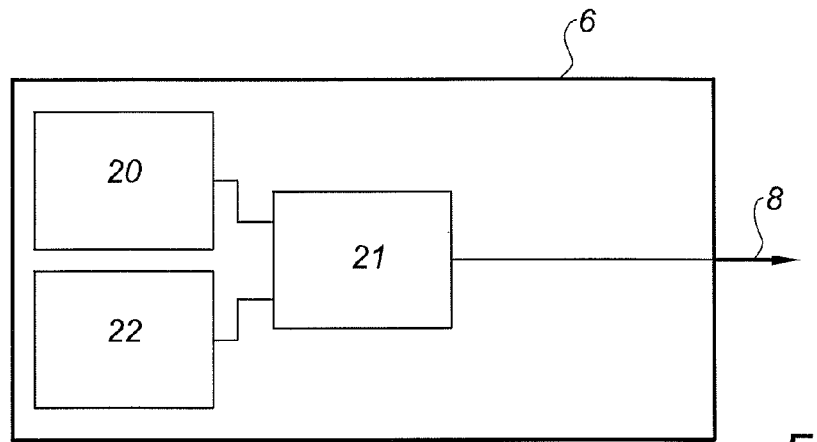
FIG. 4: a block diagram of a PWM control of the electromagnet of the contactor according to one embodiment of the invention.

The PWM modulator 6 is arranged, as shown in FIG. 4, so as to:

determine 20 the suitable nominal frequency Fch that may in particular assume a predefined value stored in a memory of the modulator;

determine 22 a variation of the frequency F from the nominal frequency Fch;

apply 21 the variations of the frequency F to generate a PWM recurrence across a control terminal 8 of the electronics switch 7 (FIG. 1).

When the variation of the frequency F is completely determined, for example in the form of one or more sequences suitable for reducing the amplitude of the parasites generated in the band from 150 kHz to 30 MHz, the sequence of variations $\{F_k; k\}$ may be recorded in a memory that is read sequentially, or calculated and generated continuously.

When the frequency variation is random, the modulator 6 comprises means for generating random values, for example such as means for determining a random value based on white noise. According to one alternative, the variation of the frequency may be pseudo-random, the modulator 6 comprising means for generating pseudo-random values for example using a table comprising values corresponding to a random selection, then choosing the values from among that selection, in particular cyclically. As an example, thirty-two values are randomly determined, then that sequence of thirty-two values is repeated cyclically.

Figure 5:
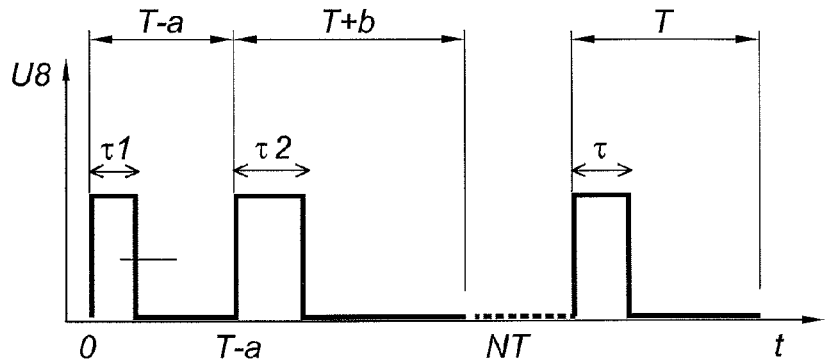
FIG. 5: a measurement graph of a PWM control of the electromagnet of the contactor of the embodiment of FIG. 4.

In one example embodiment, the contactor of FIG. 1 is used, in which a modulated random frequency PWM modulator is mounted as described above in light of FIG. 4. FIG. 5 shows a sequence of N slots, whereof the period T is determined by the nominal frequency Fch=1/T determined by the circuit 20. However, randomly, at least some periods of the sequence of the N programmed pulses have variable durations T+a; T−b; . . . T, such that a spread is obtained of the parasites generated by the contactor according to the invention. In one embodiment, the pulse duration $\tau 1$, $\tau 2, \ldots, \tau$ is equal to a given value. In another embodiment, the period (or frequency) variations +a, −b, etc. are determined randomly.

Figure 6:
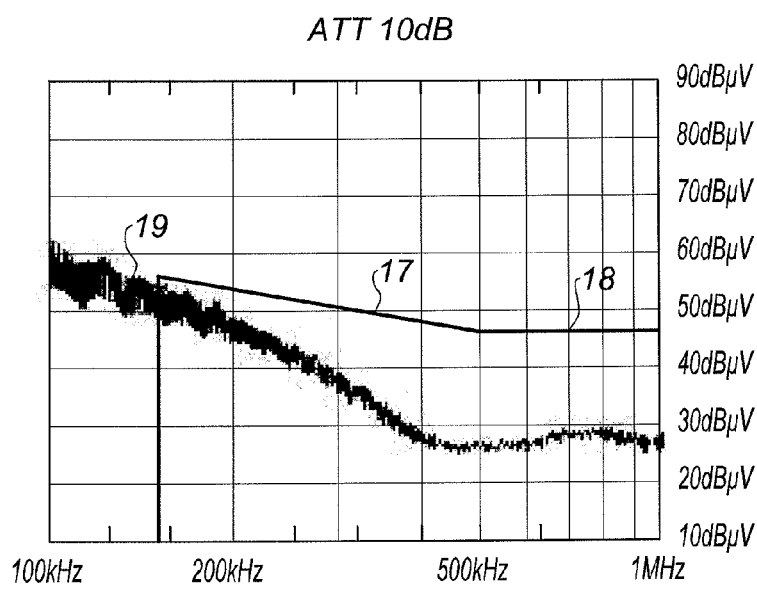
FIG. 6: a graph of the parasites generated by the control scheme of FIGS. 4 and 5.

FIG. 6 shows a graph of the parasites generated by the control scheme of FIGS. 4 and 5. The same limit caliber 17, 18 of the amplitude of the generated parasites is shown as in FIG. 3, which bears the same reference numbers. The amplitude of the parasites has been measured in the frequency band from 100 kHz to 1 MHz, and is traced along the curve 19, which passes completely below the limit caliber 17, 18.

According to another embodiment of the method, it is possible to determine the variation of the period T of the pulses using a deterministic function, in particular using a linear or piecewise linear function.

The invention claimed is:

1. A control method for an electromagnetic contactor, the method comprising:
   supplying an electromagnet of the contactor with a pulse width modulation (PWM) supply signal, the PWM supply signal having a nominal frequency; and
   varying the period of the pulses of the PWM supply signal over at least part of the pulses of the PWM supply signal so as to reduce parasites that disrupt operation of electrical and electronic apparatuses positioned near the contactor, the varying of the period of the pulses of the PWM supply signal taking into account a caliber defining an acceptable disruption limit for the parasites that disrupt the operation of the electrical and electronic apparatuses positioned near the contactor, the disruption limit being defined per frequency value in a given frequency band including the nominal frequency, the given frequency band ranging from 150 kHz to 30 MHz,
   wherein the variation of the period is chosen such that a frequency of the supply signal remains comprised in the given frequency band, the variation of the period of the pulses of the PWM supply signal determined randomly.

2. The method according to claim 1, wherein the pulse width of the supply signal is varied.

3. The method according to claim 1, wherein the function is linear or piecewise linear.

4. The method according to claim 1, wherein the variations of the period of the PWM supply signal of the period is cyclical.

5. The method according to claim 1, wherein the variation of the period of the pulses is applied so as to:
   preserve a same period over a first plurality of periods;
   modify the value of the period for a second plurality of periods.

6. The method according to claim 1, wherein the variation of the period of the pulses is applied continuously to each period.

7. An electromagnetic contactor including a control circuit configured to perform operations comprising:
   supplying an electromagnet of the contactor with a pulse width modulation (PWM) supply signal, the PWM supply signal having a nominal frequency; and
   varying the period of the pulses of the PWM supply signal over at least part of the pulses of the PWM supply signal so as to reduce parasites that disrupt operation of electrical and electronic apparatuses positioned near the contactor, the varying of the period of the pulses of the PWM supply signal taking into account a caliber defining an acceptable disruption limit for the parasites that disrupt the operation of electrical and electronic apparatuses positioned near the contactor, the disruption limit being defined per frequency value in a given frequency band including the nominal frequency, the given frequency band ranging from 150 kHz to 30 MHz,
   wherein the variation of the period is chosen such that a frequency of the supply signal remains comprised in the given frequency band, the variation of the period of the pulses of the PWM supply signal is determined randomly.

8. The contactor according to claim 7, wherein the control circuit comprises a PWM device configured to determine a variation of the frequency of the supply signal from the nominal frequency.

9. The contactor according to claim 8, wherein the PWM device comprises a modulated random frequency PWM modulator including a control circuit to generate random values.

* * * * *